United States Patent [19]

Staples et al.

[11] Patent Number: 5,272,597
[45] Date of Patent: Dec. 21, 1993

[54] ATTACHMENT FOR SURFACE-MOUNTING A RESONATOR CRYSTAL ON A CIRCUIT BOARD

[75] Inventors: Alfred G. Staples, Evergreen; Gerald E. Roberts, Lynchburg, both of Va.

[73] Assignee: Ericsson GE Mobile Communications Inc., Lynchburg, Va.

[21] Appl. No.: 883,360

[22] Filed: May 15, 1992

[51] Int. Cl.$^5$ ............................................. H05K 9/00
[52] U.S. Cl. ..................................... 361/816; 361/825
[58] Field of Search ............... 361/400, 417, 419, 423, 361/424, 427; 439/566, 571, 608

[56] References Cited

U.S. PATENT DOCUMENTS 5,055,971  10/1991  Fudala et al. .................. 361/424 X

FOREIGN PATENT DOCUMENTS 1126953  4/1962  Fed. Rep. of Germany ...... 361/400

Primary Examiner—Eugene F. Desmond
Attorney, Agent, or Firm—Nixon & Vanderhye

[57] ABSTRACT

A clip for surface-mounting a coupled-dual resonator crystal to a circuit board includes an elongated housing shaped complementary to the housing of the crystal and having an opening along a side for receiving the crystal. A tab spaces first and second shielding portions which overlie the end of the crystal housing. A first shield portion engages the middle ground terminal of the crystal shielding the input and output terminals, while the second shield extends from the first shield to overlie the output terminal, likewise shielding it from the input terminal. Distal portions of the input, output and common terminals, together with pads at the opposite end of the clip, mount the clip mechanically to the surface of a circuit board.

20 Claims, 4 Drawing Sheets

ATTACHMENT FOR SURFACE-MOUNTING A RESONATOR CRYSTAL ON A CIRCUIT BOARD

BACKGROUND AND SUMMARY OF THE INVENTION

The present invention relates to an attachment in the nature of a clip for securing a resonator crystal to a circuit board and particularly relates to a clip for surface-mounting a coupled-dual resonator crystal on a circuit board with appropriate electromagnetic shielding.

A typical coupled-dual resonator crystal includes a plate of piezoelectric material having input, output and common electrodes with a first resonator formed by the input electrode and common electrode and a second resonator formed by the output electrode and common electrode. Such coupled-dual resonator crystals are used extensively in electronic applications including IF filters, for example, for mobile and cellular radios.

In earlier work, it was found that many of the two-pole monolithic crystal filters comprised of coupled-dual resonator crystals used in mobile radios did not meet their required ultimate stopband rejection attenuation because of the close proximity of the input and output terminals of the crystal filters in a predetermined frequency range (8 MHz–25 MHz). The problem was solved by providing a grounded metal shield attached to the fixture pin into which the center pin of the crystal would be inserted, thereby placing the input terminal of the filter in one grounded conductive cavity and the output end of the filter in another grounded conductive cavity. Later, a linear array of plated-through holes on a printed circuit board was used in conjunction with the terminals of a two-pole filter so that a straight line through each of the three terminal pins was perpendicular to the axis of the array of plated-through holes. All the plated-through holes were attached to one another and grounded. The center pin of the crystal was inserted into and soldered to one of the holes toward the center of the array. This placed the input of the filter on one side of the array and the output of the filter on the other side, thereby providing a grounded shield between the input and output of the filter.

Subsequently, a two-pole crystal filter (a single coupled-dual crystal) in the 45 MHz range as one of the IF filters in a radio was tested, revealing a major problem with respect to the ultimate selectivity achieved by the two-pole crystal on the actual circuit board. The problem was exacerbated because of the close spacing between the input and output terminals. However, the problem was solved by adding a chip capacitor on the opposite side of the board on each side of the crystal along the hole array with both terminals of each capacitor attached to a hole and one terminal of each cap attached to a hole immediately adjacent to the crystal center pin.

The present invention seeks to provide similar results with a surface-mounted crystal. To accomplish this in accordance with the present invention, there is provided a clip for receiving the crystal housing. The crystal projects from an open end of the clip body and has in an aligned array input and output terminals with a common terminal therebetween. The terminals project endwise from the crystal housing in a generally Z-shaped configuration whereby the linear tips of the Z-shaped configuration project beyond the margins of the clip body for resting on contacts on the printed circuit board. The clip body includes a pair of pads at its opposite end likewise for resting on contacts with the circuit board. Consequently, the clip and crystal contained therein are mechanically balanced on the circuit board. Because the clip body is generally complementary in configuration to the crystal housing and hence in good electrical contact therewith, the pads afford two additional ground contacts for the crystal itself, as well as a ground contact at the common terminal.

Cantilevered from the body of the clip by a resilient tab extending from one side of the clip body adjacent an open end thereof is a ground shield for shielding the output terminal from the input terminal. The shield has a first shield portion which extends from its proximal edge at its connection with the tab to a distal edge projecting from the opposite side of the clip body. The first shield portion extends from the clip body in a plane parallel to a plane containing the generally Z-shaped common terminal and, when the crystal is disposed in the attachment, the first shield portion engages the common terminal. A second shield portion extends generally at right angles to the first shield portion and overlies the common and output terminals. The second shield portion specifically shields the output terminal from that portion of the electromagnetic field radiating from the part of the input terminal from the point it leaves the crystal housing to the first bend in the input terminal. The first shield portion shields the output terminal from the electromagnetic wave propagating from that part of the input lead from the first bend to the second bend. Preferably, the end edge of the first shield portion extends beyond the end or tip of the common terminal.

With the crystal within the clip, the package is disposed on a circuit board with the pads and terminals in electrical contact with correspondingly located contacts on the circuit board. While the clip will inherently make electrical contact with the crystal housing, preferably a solder attachment of the clip to the crystal housing affords better ground contact than a strictly pressure contact. The configuration of the first and second shield portions makes the shield intrinsically stable mechanically without attaching it directly to the center pin of the crystal. Also, the clip and crystal are supported by the circuit board at five discrete locations, affording improved resistance to shock and vibration and greater stability. Furthermore, for a given clip size, longer or shorter crystal packages may be provided, although each clip can be sized for a particular size of crystal.

In a preferred embodiment according to the present invention, an apparatus is provided for surface-mounting a coupled-dual resonator crystal to a circuit board, the crystal having a generally elongated housing with input and output terminals and a common terminal therebetween, all of the terminals projecting from an end of the crystal. The apparatus comprises a clip including an elongated body forming a receptacle for receiving the crystal housing, the clip body having an open end, and an electromagnetic radiation shield including generally angularly related first and second shield portions. Resilient means engageable with the crystal for retaining the crystal within the body, and means connecting the body and the shield to one another and spacing the shield from the body adjacent the open end of the body are provided. The first shield portion comprises a first generally planar element extending across the open end for disposition between the input or output terminal and the common terminal of the crystal when the crystal is disposed in the clip.

In a further preferred embodiment according to the present invention, there is provided apparatus for surface-mounting a coupled-dual resonator crystal to a circuit board, the crystal having a generally elongated housing with input and output terminals and a common terminal therebetween, all of the terminals projecting from an end of the crystal. The apparatus comprises a clip including an elongated body forming a receptacle for receiving the housing of the crystal, the clip having an open end, an electromagnetic radiation shield including a shield portion and means connecting the body and the shield portion spacing the shield portion from the body and extending from the clip body adjacent an open end. The shield portion comprises a generally planar element extending across that open end for disposition between the input or output terminal and the common terminal of the crystal when the crystal is disposed in the clip.

Accordingly, it is a primary object of the present invention to provide an attachment for surface-mounting a coupled-dual resonator crystal affording improved mechanical and electrical contact with the circuit board, as well as shielding between the input and output terminals.

These and further objects and advantages of the present invention will become more apparent upon reference to the following specification, appended claims and drawings.

BRIEF DESCRIPTION OF THE DRAWING FIGURES

DETAILED DESCRIPTION OF THE DRAWING FIGURES

Reference will now be made in detail to a present preferred embodiment of the invention, an example of which is illustrated in the accompanying drawings.

Figure 1:
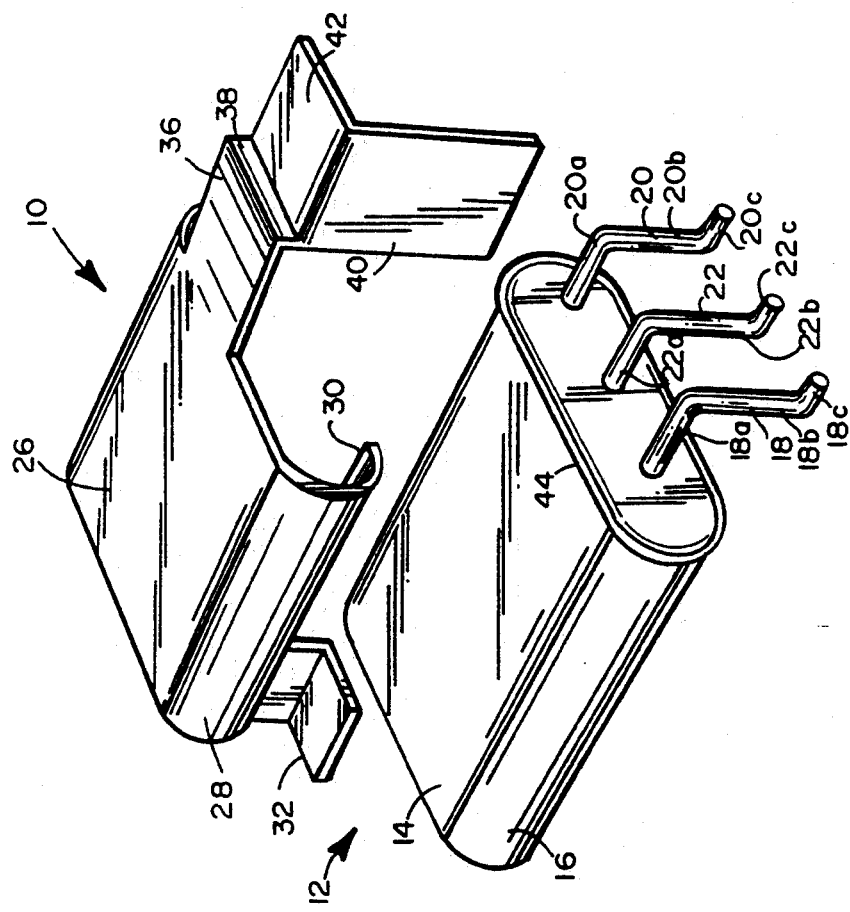
FIG. 1 is a perspective view of a clip for mounting a coupled-dual resonator crystal to a circuit board in accordance with the present invention.
Figure 4:
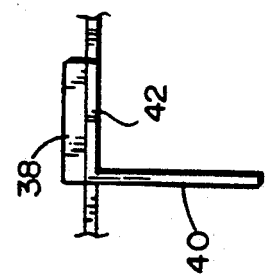
FIG. 4 is a fragmentary end elevational view of the clip illustrated in FIG. 3 looking from right to left.
Figure 6:
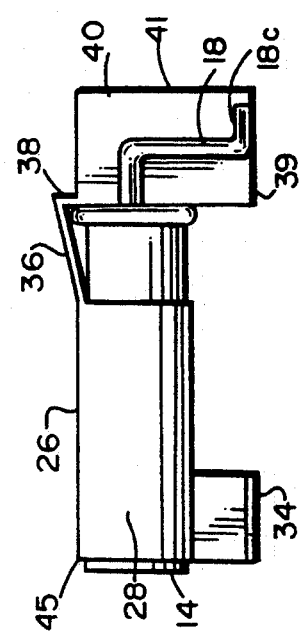
Figure 5:
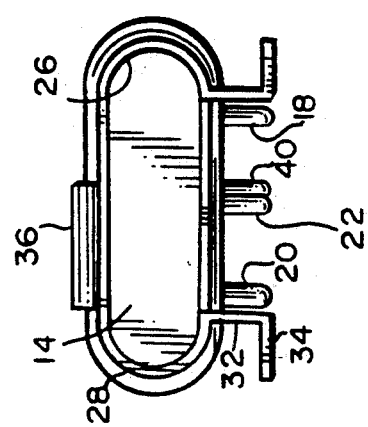
FIG. 5 is an end elevational view of the clip with the resonator crystal secured therein.
Figure 8:
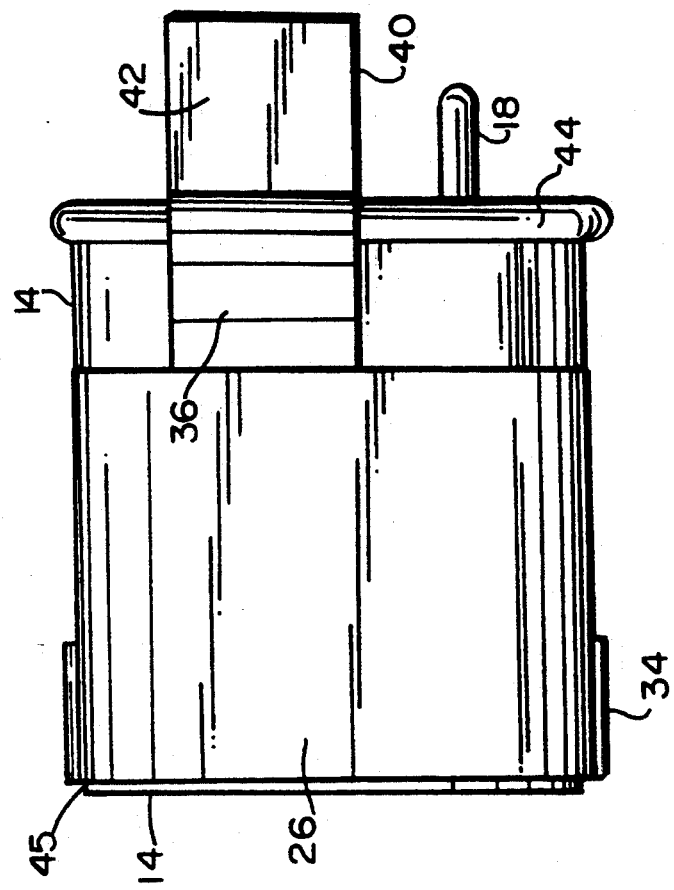
FIG. 8 is a top plan view of the clip with the resonator crystal mounted therein.

Referring now to the drawings, particularly to FIG. 1, there is illustrated a clip, generally designated 10, constructed in accordance with the present invention, for mounting a coupled-dual resonator crystal, generally designated 12, on a circuit board, not shown. The coupled-dual resonator crystal 12 includes a generally elongated housing 14 with rounded sides 16 and input and output terminals 18 and 20, respectively, projecting from an end thereof with a ground terminal 22 therebetween. As illustrated, the terminals preferably have a like configuration, including proximal horizontal, vertical and distal portions designated by the suffixes "a", "b" and "c", respectively, following the numeral identifying the particular terminal. As best seen in FIGS. 1 and 6, the horizontal proximal portions 18a, 20a and 22a project along a horizontal median of the end surface of the crystal 12, with the distal portions 18c, 20c and 22c projecting to one side of housing 14. It will be appreciated that the crystals 12 may be provided in various sizes and that clips 10 may similarly be provided in various sizes and dimensions to accommodate a particular coupled-dual resonator crystal.

Referring particularly to FIGS. 1-4, clip 10 includes an elongated body having a flat upper side 26 and curved side walls 28 forming a receptacle for the crystal, clip 10 having an open side opposite side 26 and between the side walls 28. The clip 10 is formed of metal and thus has a resilience and flexibility such that it may receive the housing 14 of the resonator crystal. The housing 26 is substantially complementary in shape to the crystal but slightly smaller so that the clip resiliently bears against the crystal housing. The opposite ends of housing 26 are open.

Figure 2:
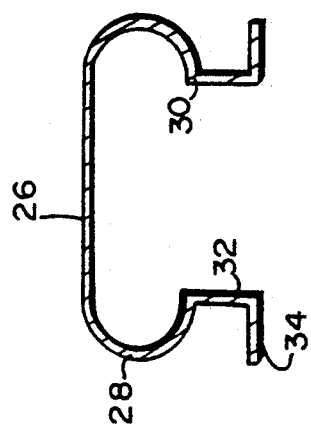
FIG. 2 is a cross-sectional view thereof taken about on lines 2—2 in FIG. 3.

For purposes of surface-mounting the resonator crystal 12 to a circuit board, feet 32 project from one end and to both sides of housing 26. As illustrated in FIG. 2, feet 32 form a generally L-shaped configuration, terminating in a generally horizontal pad 34. From the foregoing description, it will be appreciated that the crystal resonator disposed in the clip as illustrated in FIG. 6 is mounted on the surface of the circuit board such that the circuit board underlies the pads 32 and the distal portions 18c, 20c and 22c of the input, output and common terminals, respectively.

Figure 3:
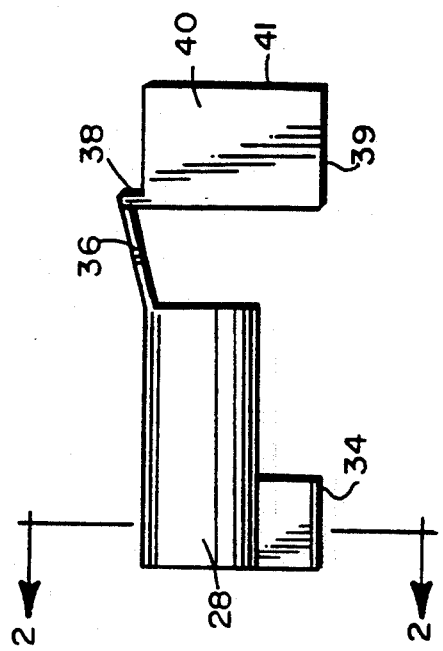
FIG. 3 is a side elevational view of the clip illustrated in FIG. 1.

Projecting from an open end of clip 10 is a tab 36. Tab 36 forms a continuation of the flat side 26 of clip 10 and is laterally offset to one side of the clip body. As illustrated in FIG. 3, tab 36 angles away from the side 26, terminating in a flange 38 projecting toward the housing. Integrally connected with tab 38 is shielding S comprised of a downwardly projecting first shield portion 40 and a second shield portion 42 angularly related to the first shield portion 40, the shield portions being disposed preferably at right angles relative to one another. That is, the second shield portion 42 projects generally horizontally from flange 38, and first shield portion 40 extends from a longitudinally extending edge of second shield portion 42 in a downward direction. It will be appreciated that the tab 36 spaces shielding S, i.e., the first and second shield portions 40 and 42, respectively, from the body of the clip. Also, the first shield portion 40 is located such that, when the resonator crystal is disposed in the clip, as described hereinafter, first shield portion 40 extends between the input terminal 18 and the common terminal 22 with the first shield portion 40 engaging the common terminal 22. Also, as illustrated in FIG. 7, the second shield portion 42, extends from the first shield portion and above the common terminal toward the output terminal 20 in overlying relation thereto.

To use the clip, the crystal 14 is inserted into the clip 14 through the open side. That is, one curved side of crystal 14 is inserted through the open clip side to engage against one curved side wall 28 while the other curved wall 28 is resiliently retracted to enable the opposite curved side of crystal 14 to be received within the clip body. Once received within the clip, it will be appreciated that flange 38 overlies the rib 44 at the end of the resonator crystal from which the terminals project. While the clip resiliently mechanically secures the crystal within the clip body, the crystal may be tack-soldered to the clip, for example, at 45, as illustrated in FIG. 6. Also, the shield portion 40 may be tack-soldered to the vertical portion 22b of the common terminal 22, as illustrated at 47 in FIG. 7. Further, as illustrated in FIG. 6, the distal end edge 39 of the first shield portion 40 lies coextensively with the outer edge of the distal terminal portion 22c. Additionally, the distal end of the terminal portion 22c lies short of the vertical edge 41 of the first shield portion 40.

To mount the resonator crystal and clip on the circuit board, the pads 32 and the distal terminal portions 18c, 20c and 22c are disposed on correspondingly located contacts on the circuit board. It will be appreciated that the housing 14 of the resonator crystal and the clip body make electrical contact one with the other. Consequently, not only do the pads 32 afford mechanical balance to the entire assembly as it rests on the circuit board, but the pads 32, in conjunction with the distal portion of the common terminal 22, afford ground contact for the crystal itself. The clip may then be mechanically secured to the circuit board, for example, by soldering at the contact points, allowing circuit runs to exist under the crystal on the circuit board.

Figure 7:
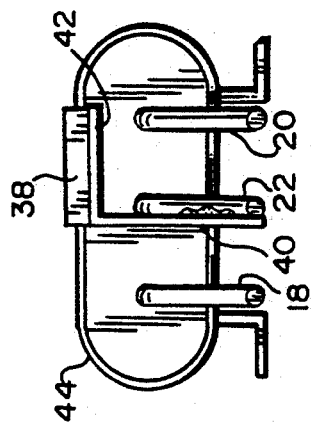
FIGS. 6 and 7 are side and end elevational views illustrating the clip with the resonator crystal mounted therein.

From a review of FIGS. 6 and 7, it will be appreciated that the first shield portion 40 affords a ground shield at the middle terminal of the crystal shielding the output terminal 20 from the input terminal 18. Furthermore, the horizontal second shield portion 42 shields the output terminal from that portion of the electromagnetic field radiating from that part of the input terminal 18 from the point it leaves the crystal resonator to the first bend, i.e., the proximal portion 18a of terminal 18. The electromagnetic wave propagating from the intermediate portion 18b of the input terminal is shielded from the output terminal 20 by the area of the first shield portion 40 spanning between the proximal and distal portions 22a and 22c of the common terminal 22. Additional shielding is provided because the end edge of the vertical or first shield portion 40 projects beyond the distal end of the common terminal 22. While the shielding portions 40 and 42 afford effective shielding for the surface-mounted resonator crystal, this arrangement renders the shield portions, as well as the clip, intrinsically stable mechanically, without attaching the shield portion directly to the common terminal of the resonator crystal.

Because the clip spaces the resonator crystal from the circuit board, electrical runs can meander under the surface-mounted crystal as the ground pads and the terminals provide the only points of contact between the resonator crystal in the clip and the circuit board. Additionally, the five-point contact of the crystal resonator mounted within the clip on the circuit board affords improved resistance to shock and vibration. It will also be appreciated that for a given clip size, longer or shorter crystal resonators may be used, thereby affording a single clip for surface-mounting crystals having a wide range of crystal sizes to a circuit board.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. Apparatus for surface-mounting a coupled-dual resonator crystal to a circuit board, the crystal having a generally elongated housing with input and output terminals and a common terminal therebetween, all of said terminals projecting from an end of the crystal, comprising:

a clip including an elongated body forming a receptacle open at one end for receiving the crystal housing, said clip body having an open end and an electromagnetic radiation shield including generally angularly related first and second shield portions;

resilient means engageable with the crystal for retaining the crystal within the body;

means connecting said body and said shield to one another and spacing said shield from said body adjacent the open end of said body;

said first shield portion comprising a first generally planar element extending across said open end for disposition between the input or output terminal and the common terminal of the crystal when the crystal is disposed in said clip.

2. Apparatus according to claim 1 wherein said clip body has an open side for receiving the crystal within the clip.

3. Apparatus according to claim 1 wherein said body includes a pair of pads carried by said body adjacent the end of said body opposite its open end and projecting along one side of the clip, said first shield portion having a distal end projecting along said one side of said clip wherein the pads and distal end of said shield portion are adapted for engagement with the circuit board at three discrete locations.

4. Apparatus according to claim 1 wherein said first shield portion extends from a proximal edge along one side of said body to a distal edge along the opposite side of said body, said second shield portion comprising a second planar element extending laterally from the proximal edge of said first shield portion to a distal edge thereof to afford electromagnetic shielding between the input and output terminals of the crystal when disposed in said clip.

5. Apparatus according to claim 1 wherein said resilient means forms part of said connecting means, said connecting means including a resilient tab extending from said body away from said open end thereof terminating in said shield.

6. Apparatus according to claim 5 wherein said body includes a side wall, said tab extending from said side wall and connecting with said first shield portion extending along a proximal edge portion, said first shield portion extending across said open end, terminating in a distal edge portion adjacent the opposite side of said body, said shield being cantilevered from said body by said tab.

7. Apparatus according to claim 6 wherein said side wall is generally flat and a pair of arcuate walls extend from respective opposite edges of said flat side wall for at least partially enveloping the crystal, and a pair of pads carried by said body adjacent the end of said body opposite the open end thereof and projecting from a side of said clip opposite said side wall for supporting the clip on the circuit board.

8. Apparatus according to claim 1 in combination with said crystal, said crystal having the input, output and common terminals projecting from said one end of said crystal with at least said common terminal having angular portions defining a plane extending between said input and output terminals, said first shield portion extending in a plane parallel to the plane containing said common terminal and lying in contact with said common terminal when said crystal lies within said clip.

9. Apparatus according to claim 8 wherein an edge of said first shield portion extends beyond the distal tip of said common terminal.

10. Apparatus according to claim 8 wherein said second shield portion extends generally at right angles to said first shield portion and overlies said output terminal for shielding the output terminal from a portion of the electromagnetic field radiating from the input terminal.

11. Apparatus according to claim 8 wherein said terminals project to one side of said clip and beyond the peripheral margin of said clip along said one side thereof, and a pair of pads carried by said body adjacent the end of said body opposite the open end and projecting from said one side of said clip beyond its peripheral confines for engaging with the circuit board.

12. Apparatus for surface-mounting a coupled-dual resonator crystal to a circuit board, the crystal having a generally elongated housing with input and output terminals and a common terminal therebetween, all of said terminals projecting from an end of the crystal comprising:
   a clip including an elongated body forming a receptacle for receiving the housing of said crystal and having an open end, said clip having an electromagnetic radiation shield including a shield portion;
   means carried by said clip body for engaging the crystal and retaining the crystal within the body;
   means connecting said body and said shield portion spacing said shield portion from said body and extending from said clip body adjacent its open end;
   said shield portion comprising a generally planar element extending across said open end for disposition between the input or output terminal and the common terminal of the crystal when the crystal is disposed in said clip.

13. Apparatus according to claim 12 wherein said body includes a pair of pads carried by said body adjacent the end of said body opposite its open end and projecting along one side of the clip, said shield portion having a distal end projecting along said one side of said clip wherein the pads and distal end of said shield portion are adapted for engagement with the circuit board at three discrete locations.

14. Apparatus according to claim 12 wherein the first-mentioned shield portion extends from a proximal edge along one side of said body to a distal edge along the opposite side of said body, a second shield portion comprising a second planar element extending laterally from a proximal edge of said first shield portion to a distal edge thereof to afford electromagnetic shielding between the input and output terminals of the crystal when disposed in said clip.

15. Apparatus according to claim 12 wherein said connecting means includes a resilient tab extending from said body away from said open end thereof terminating in said shield and engageable with the crystal when disposed in the clip body.

16. Apparatus according to claim 15 wherein said body includes a side wall, said tab extending from said side wall and connecting with said shield portion extending along a proximal edge portion, said shield portion extending across said open end, terminating in a distal edge portion adjacent the opposite side of said body, said shield being cantilevered from said body by said tab.

17. Apparatus according to claim 16 wherein said side wall is generally flat and a pair of arcuate walls extend from respective opposite edges of said flat side wall for at least partially enveloping the crystal, and a pair of pads carried by said body adjacent the end of said body opposite the open end thereof and projecting from a side of said clip opposite said side wall for supporting the clip on the circuit board.

18. Apparatus according to claim 12 in combination with said crystal, said crystal having the input, output and common terminals projecting from said one end of said crystal with at least said common terminal having angular portions defining a plane extending between said input and output terminals, said shield portion extending in a plane parallel to the plane containing said common terminal and lying in contact with said common terminal when said crystal lies within said clip.

19. Apparatus according to claim 18 including a second shield portion extending generally at right angles to the first-mentioned shield portion and overlying said output terminal for shielding the output terminal from a portion of the electromagnetic field radiating from the input terminal.

20. Apparatus according to claim 19 wherein said terminals project to one side of said clip and beyond the peripheral margin of said clip along said one side thereof, and a pair of pads carried by said body adjacent the end of said body opposite the open end and projecting from said one side of said clip beyond its peripheral confines for engaging with the circuit board.

* * * * *